US007229669B2

(12) United States Patent
Youngner et al.

(10) Patent No.: US 7,229,669 B2
(45) Date of Patent: Jun. 12, 2007

(54) THIN-FILM DEPOSITION METHODS AND APPARATUSES

(75) Inventors: Dan W. Youngner, Maple Grove, MN (US); Leonard A. Hilton, Buffalo, MN (US)

(73) Assignee: Honeywell International Inc., Morristown, NJ (US)

( * ) Notice: Subject to any disclaimer, the term of this patent is extended or adjusted under 35 U.S.C. 154(b) by 118 days.

(21) Appl. No.: 10/712,444

(22) Filed: Nov. 13, 2003

(65) Prior Publication Data

US 2007/0110899 A1 May 17, 2007

(51) Int. Cl.
*C23C 16/00* (2006.01)
*B05D 1/36* (2006.01)

(52) U.S. Cl. .............................. 427/255.15; 427/97.1; 427/402

(58) Field of Classification Search .............. 427/96.2, 427/58, 97.1, 96.8, 97.4, 248.1, 226, 402, 427/372.2, 255.15; 118/720, 721
See application file for complete search history.

(56) References Cited

U.S. PATENT DOCUMENTS 3,148,085 A 9/1964 Wiegmann
3,300,332 A * 1/1967 Gorham et al. ............. 423/274
3,936,545 A 2/1976 Brill et al.
4,434,434 A 2/1984 Bhattacharya et al.
5,641,611 A * 6/1997 Shieh et al. ................ 430/321
5,657,340 A 8/1997 Camparo et al.
5,805,111 A 9/1998 Brettner, III et al.
5,929,515 A * 7/1999 Greiff et al. ................ 257/682
5,953,587 A * 9/1999 Forrest et al. ................ 438/99
5,959,338 A 9/1999 Youngner et al.
6,013,538 A * 1/2000 Burrows et al. .............. 438/22
6,277,666 B1 8/2001 Hays et al.
6,338,775 B1 1/2002 Chen
6,358,433 B1 3/2002 Tan et al.
6,361,206 B1 3/2002 Bonne
6,372,154 B1 * 4/2002 Li ......................... 252/301.16
6,426,538 B1 7/2002 Knowles
6,550,310 B1 4/2003 Liu et al.

(Continued)

FOREIGN PATENT DOCUMENTS

FR 1 319 182 2/1963
GB 1 570 777 7/1980

(Continued)

OTHER PUBLICATIONS

Brown, "RF-MEMS Switches for Reconfigurable Integrated Circuits," IEEE Transactions on Microwave Theory and Techniques, vol. 46, No. 11, pp. 1868-1880, Nov. 1998.

(Continued)

*Primary Examiner*—Timothy Meeks
*Assistant Examiner*—David Turocy
(74) *Attorney, Agent, or Firm*—McDonnell Boehnen Hulbert & Berghoff LLP

(57) ABSTRACT

Described are structures useful in microelectronic or MEMS devices such as atomic clocks, sensors, and RF switches, wherein a first material is deposited onto a substrate to define a first material area of coverage and a second material is deposited over the first material area of coverage to define a second material area of coverage that includes the first material area of coverage and that additionally includes area that surrounds the first material area of coverage, such that the first material is enclosed by the second material over the entire area and past the edges of the first material.

22 Claims, 3 Drawing Sheets

U.S. PATENT DOCUMENTS

| | | | | |
|---|---|---|---|---|
| 6,568,286 | B1 | 5/2003 | Cabuz | |
| 6,570,459 | B1 | 5/2003 | Nathanson et al. | |
| 6,630,725 | B1 | 10/2003 | Kuo et al. | |
| 6,639,289 | B1 | 10/2003 | Hays | |
| 6,900,702 | B2 * | 5/2005 | Youngner et al. | 331/94.1 |
| 2003/0087471 | A1 | 5/2003 | Shtein et al. | |
| 2003/0138656 | A1 * | 7/2003 | Sparks | 428/615 |
| 2004/0038075 | A1 * | 2/2004 | Wang et al. | 428/690 |
| 2004/0061136 | A1 * | 4/2004 | Tyan et al. | 257/200 |

OTHER PUBLICATIONS

Kim et al., "Mercury Contact Micromechanical Relays," Proc. 46$^{th}$ Annual Int. Relay Conf., Oak Brook, IL, pp. 19-1 to 19-8, Apr. 1998.

Nattland et al., "Interfacial Properties of Liquid Alloys: An Experimental Study on Ga-Bi and Ga-Ge," Ber. Bunsenges. Phys. Chem. 102, No. 9, 1151-1155, 1998.

* cited by examiner

THIN-FILM DEPOSITION METHODS AND APPARATUSES

This invention was made with Government support under Contract No. N66001-02-C-8019, awarded by the Department of the Navy. The Government has certain rights in this invention.

FIELD OF THE INVENTION

The invention relates generally to methods and apparatus for depositing thin-films. In particular, the invention relates to methods and apparatus for depositing a first (e.g., reactive) material on a surface of a substrate and depositing a second material, e.g., a covering material (or passivating material), to cover and preferably enclose the first material. The present invention can be particularly useful for forming MEMS structures such as atomic clock structures, RF switches, and related microelectronic structures and devices.

BACKGROUND OF THE INVENTION

Microelectronic-Mechanical Systems (MEMS) devices include a variety of micron or nano-scale devices such as switches, sensors (e.g., chemical sensors), gyroscopes, accelerometers, and atomic clock devices. Due to the small scale of these devices and their components, the devices require manufacturing processes that allow for the production of small scale features, without contaminating or altering the desired chemical makeup of the components of the device.

MEMS devices are important for their highly precise and accurate measurement capabilities. A specific example of a MEMS device, an atomic clock, can be used in various systems that require extremely accurate and stable frequencies, such as in bistatic radars, global positioning systems, and other navigation and positioning systems, as well as in communications, cellular phone systems, and scientific experiments, for example.

One type of atomic clock known as a cell type atomic clock operates by simultaneously irradiating an active medium with optical power and microwave power. The optical power pumps the active atoms, usually rubidium or cesium, to make the medium absorbing at the microwave frequency corresponding to transitions between the two hyperfine levels of the ground state. It is desirable to have the longest amount of time possible to measure the energy levels (frequency) of such atoms. One way to obtain a long measurement time is to keep the atoms in one place while measuring them. One way of doing this is to contain the atoms in a cavity or cell, for example. Generally, such cell structures provide a vacuum environment wherein the active medium can be controllably provided as a vapor.

An RF switch is an active RF component that switches a single input between one or more outputs. RF switches also can include a cavity that contains an extremely small amount of a functional material, e.g., liquid galliums.

Because certain materials that are used in MEMS devices, e.g., rubidium, cesium, gallium, alkali metals, etc., can be extremely reactive, processing these materials can be difficult. In general, these materials need to be carefully handled such that they are not exposed to atmosphere thereby initiating undesirable reactions or introducing contamination.

SUMMARY OF THE INVENTION

The invention provides methods and apparatuses for depositing (coating) thin-films onto a substrate. For example, the invention provides methods for depositing a first (e.g., reactive) material onto a surface of a wafer, followed by covering (preferably enclosing) the first material to allow further processing. The first material can be any material useful, e.g., in a MEMS device, and that preferably benefits from avoiding exposure to contaminants. A reactive material can be a type of material that is highly reactive, such as rubidium, cesium, or other alkali metals (lithium, sodium, potassium). Reactive materials, while useful in MEMS devices, can be very difficult to process due to their reactivity—the materials may ignite or react, sometimes explosively, with water, atmospheric air (containing water), or wet chemicals used in subsequent microelectronic device processing steps. Thus, the materials cannot be allowed to contact air or wet chemicals during processing of a MEMS device.

According to the invention, a first material is deposited on a substrate, followed by a second (covering) material that encloses the first material against the substrate to prevent contact of the first material with contaminants, air, wet chemicals, or water, etc., to prevent contamination or reaction of the first material during subsequent processing. Thus, the present methods provides methods for depositing a covering material over a first material deposited on a substrate, such that the covered first material can be further processed without exposing the first material to atmosphere, so the reactive material is prevented from reacting or becoming contaminated. Also according to the invention, the covering material can later be degraded, broken, or opened, to expose the first material when desired. Typically, with MEMS devices, a reactive material can be enclosed in a cavity of a device, so the covering material is desirably degraded, broken, or opened, after the cavity is established, so the reactive material, for example, escapes into the cavity.

The methods and structures of the invention can be useful in MEMS devices such as RF switches, atomic clocks, chemical sensors, etc.

An aspect of the invention relates to a method for providing a reactive material enclosed by a covering material on a substrate. The method includes: providing a substrate having a surface, fixing a shadow mask over the substrate in a position to align an aperture of the shadow mask with a portion of the surface, positioning the shadow mask and substrate in a vacuum deposition chamber having a reactive material deposition source and a covering material deposition source, providing a vacuum in the vacuum deposition chamber, evaporating reactive material from the reactive material deposition source such that the reactive material passes through the aperture of the shadow mask and deposits on the surface to define an area of coverage of the reactive material, and evaporating covering material from the covering material deposition source to produce an area of coverage of the covering material that is greater than the area of coverage of the reactive material and that includes the area of coverage of the reactive material, to enclose the reactive material coated on the substrate.

In another aspect, the invention relates to a method for providing layers of materials on a substrate. The method includes providing a substrate including a surface, fixing a shadow mask over the substrate in a position to align an aperture of the shadow mask with a portion of the surface, positioning the shadow mask and substrate in a vacuum deposition chamber having a first material deposition source and a second material deposition source, providing a vacuum in the vacuum deposition chamber, evaporating first material from the first material deposition source at an angle of incidence substantially normal to the portion of surface, such that the first material passes through the aperture of the shadow mask and deposits on the portion of surface to define an area of coverage of the first material, and, while rotating the substrate and shadow mask on an axis normal to the portion of surface, evaporating second material from the second material deposition source at an angle of incidence oblique to the axis, such that second material passes through the aperture of the shadow mask and deposits on the first material, to produce an area of coverage of the second material greater than the area of coverage of the first material and including the area of coverage of the first material.

Another aspect of the invention relates to an assembly that includes: a substrate including a surface, a shadow mask having a deposition opening spaced apart from the surface for defining an area of deposition on the substrate surface, a fixture that fixes the position of the substrate relative to the shadow mask, and a device to rotate the fixture on an axis normal to the substrate surface.

Yet another aspect of the invention relates to a substrate that includes first deposited material and second deposited material, the first material having a first area of coverage and the second material having a second area of coverage that includes the first material area of coverage and area that surrounds the first material area of coverage.

Another aspect of the invention relates to a method of preparing a microelectronic mechanical device. The method includes depositing a first material onto a substrate surface, depositing a second material over the first material to enclose the first material, encapsulating the first and second materials deposited on the substrate, and degrading the second material to expose the first material.

BRIEF DESCRIPTION OF THE DRAWINGS

The accompanying drawings, which are incorporated in and constitute a part of this application, illustrate several aspects of the invention and together with a description of the embodiments serve to explain the principles of the invention. A brief description of the drawings is as follows.

DETAILED DESCRIPTION

Figure 1:
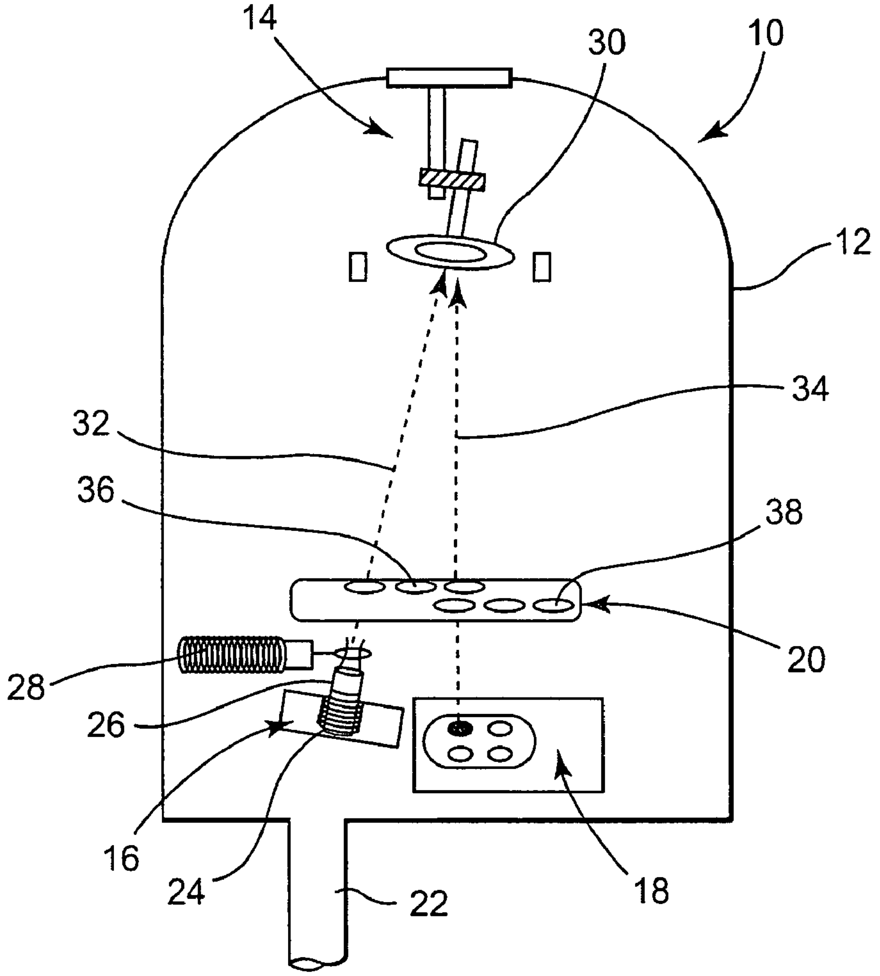
FIG. 1 is a schematic side view of a vacuum deposition system having a reactive material source, a covering material source, a substrate stage, and a shutter.

The invention provides methods and apparatus for forming (depositing, condensing, coating) thin-film structures on a substrate, e.g., structures that can be used for MEMS devices. In particular embodiments, the invention provides methods and apparatus for depositing a reactive material onto a substrate, and covering the reactive material with a covering material to enclose the reactive material for further processing. The covering material can protect the reactive material from exposure to materials that might react with the reactive material, such as water, air, or wet processing materials. The substrate that includes the covered reactive material can be further processed to form an enclosure or cavity around the covered reactive material. When desired, the covering material can later be processed while inside the cavity, e.g., by causing the covering material to degrade, to expose the reactive material to the cavity.

The reactive material and covering material can be formed on a surface of a desired substrate. The substrate may be any useful substrate, such as a substrate for preparing MEMS devices such as atomic clocks, RF switches, chemical sensors, etc. A substrate may be particular to a desired device. Exemplary substrates may include silicon (e.g., for an atomic clock), quartz (e.g., for a RF switch), Pyrex, and the like.

If desired, the substrate may have a cavity in which a base surface is located. A cavity may be desirable, for example, for forming a cavity or enclosure of a device in which a reactive material is located in a MEMS device. Thus, the presence or absence of a cavity in as substrate can depend on particular steps by which a certain MEMS devices is prepared. According to one embodiment of the invention useful for preparing atomic clock structures, a substrate may be a silicon wafer that includes a cavity. Reactive material may be deposited at the base surface of the cavity and then covered with covering material, followed by additional processing. Another example of a substrate that may include a cavity is a quartz substrate used to produce an RF switch. Alternatively, such MEMS devices may be prepared with a substrate that does not include a cavity.

A cavity, if included in a substrate, may be formed by known methods of processing microelectronic and semiconductor-type substrates, such as by etching or other techniques for producing topography. The size (e.g., depth and area) of a cavity can be particular to the device to be prepared from a substrate, e.g., the desired size of an enclosure or cavity within which a reactive material is to function.

According to the invention, a material (a “first” material, e.g., a reactive material) is deposited onto a surface of a substrate. Depending on the device being prepared and the subsequent processing steps that will be used to form the particular device, the surface may be a surface that is located within a recess or cavity in a substrate. Alternatively, the surface may not be recessed, or may even be a raised surface or platform extending from the substrate.

The first (e.g., reactive) material can be any material that can function as a component of a microelectronic or MEMS device and that is desirably prevented from being exposed to contaminants, air, water, or processing materials, during further processing of the substrate (with deposited reactive material) to form a microelectronic or MEMS device. The material may be one that is desirably protected during further processing to avoid contamination, or may be one that is reactive or highly reactive. A reactive or highly reactive material may be reactive to a degree that the material ignites or even explodes upon contact with atmospheric air or water, or with liquid water or liquid processing materials that may be used in further processing a substrate into a microelectronic or MEMS device following deposition of the first material.

The particular first material deposited onto a given substrate can be a material selected to function as a component in a specific device, e.g., MEMS device. As an example, rubidium or cesium may be used in preparing an atomic clock structure (e.g., by deposition on a silicon wafer substrate). Another example of a reactive material is gallium, which can be deposited onto a substrate (e.g., quartz) in preparation of an RF switch device. Other examples of reactive materials include alkali metals such as lithium, potassium, and sodium. These materials are known and available in forms and purities useful for vapor deposition according to known techniques.

The amount of a reactive material deposited onto a substrate can be any amount that is desired for use in a particular device such as an atomic clock, RF switch, etc. In terms of area of coverage, any desired area of coverage of reactive material can be used, depending on the type of device being prepared. The thickness can also vary depending on the type of device. Exemplary thicknesses of a reactive material deposited onto a substrate may be in the micron range, e.g., from 0.1 to 100 microns, or from 0.5 to 10 microns. Still, thicknesses outside of these ranges may also be useful.

Further according to the invention, the first material (e.g., reactive material) can be coated by a second material (e.g., a covering material), such that the second material covers the first material and additionally covers at least a small amount of area that around the edges and surrounding the area of coverage of the reactive material, e.g., the second material covers and encloses the first material between the substrate and the second material.

The particular covering material deposited onto a given substrate and first (e.g., reactive) material can be a covering material that can be coated (e.g., deposited) onto a substrate, and thereafter can function as described herein to protect a first material from other materials such as water, air, moisture, contaminants, or liquid processing materials used in subsequent steps of processing a substrate. The covering material can be selected based on its properties, such as an ability to act as a barrier against water, air, moisture, contaminants, etc., and optionally on other properties such as an ability to degrade due to heat or laser treatment during a desired subsequent processing step. A second material can preferably be inert from reacting with or otherwise interfering with the end function of the first material, and can preferably be compatible with the overall function of the device being produced. The need for a covering material to have an ability to be degraded may also depend on the type of device being prepared, and can be particularly useful for preparing structures useful in atomic clocks devices, which require a reactive material to be released from below the covering material into a cavity or enclosure.

A second material may also be selected based on factors such as the type of device that is being prepared, and the type of first coated (e.g., reactive) material that is to be covered by the second material. Examples of useful second materials include metals such as aluminum and tungsten, as well as organic materials such as waxes or paraffin. In certain specific product constructions, aluminum may be coated as a coating material over a rubidium or cesium reactive material coated on a silicon substrate, to prepare a structure useful in an atomic clock. In another specific product constructions, tungsten may be coated as a coating material over a gallium reactive material to prepare a structure useful in an RF switch.

The amount of second material deposited over a first (e.g., reactive) material can be any amount desired for use in a device such as an atomic clock, RF switch, etc., and that can prevent a first deposited material from becoming contaminated or from reacting during subsequent processing of the substrate to form a MEMS device. The amount of covering material should be sufficient to completely cover and enclose the first deposited material and prevent contamination of the first deposited material or reaction of a deposited reactive material with water, air, or wet processing materials. In certain embodiments of the invention, a useful amount of covering material may also be an amount that can be degraded at a desired later time in processing to expose a deposited reactive material to an internal cavity or enclosure of a MEMS device, as desired.

In terms of area, the covering material can be deposited according to certain preferred methods of the invention, to completely cover and enclose a first, (e.g., reactive) material, and additionally, to cover an area slightly larger than the area of the first material. According to certain embodiments of methods of the invention—e.g., that involve shadow mask techniques, a rotating substrate and shadow mask fixture device, and a covering material source deposited from an oblique angle relative to a substrate surface—a covering material can be deposited over the entire area of the first coated (e.g., reactive) material and to additionally cover an amount of additional area past the edges of the area of coverage of the first material to enclose the first material between the substrate and the second material. The first material is covered and sealed between the substrate and the second (e.g., coating) material in a manner that prevents the first material from being exposed at its surface or edges. The amount of additional area of coverage of the second material, beyond the area of coverage of the first (e.g., reactive) material, can depend on factors such as the method of depositing the coating material, such as the angle of incidence of the second material source (from normal to the substrate surface at the location of coating); the distances of the first and second material sources from the substrate, which may be the same or different; and the distance of the shadow mask opening from the substrate surface. These factors may be controlled and adjusted to produce a desired area of coverage of the second (coating) material that goes beyond the edges of the area of coverage of the first (e.g., reactive) material. As an exemplary embodiment, a covering material may cover the area of coverage of a first material, and additionally cover an amount of area beyond the edges of the area of coverage of the first material, e.g., in the form of an extended edge surrounding the area of coverage of the first material and extending an additional width, e.g., a width in the range of microns, e.g., from 1 to 100 microns or from 10 to 50 microns, when measured as the distance from the edge of the area of coverage of the first material to the edge of the deposited second (covering) material.

The thickness of the second (covering) material can be a desired thickness, preferably a thickness that, depending on the type of second (covering) material, will protect the first deposited material from contacting air, atmosphere, water, wet processing materials, etc., to prevent reaction or contamination of the first material during subsequent processing steps in preparing a device. Optionally, the covering material may be of a thickness that allows for degradation or disruption of the covering material at a desired time during subsequent processing, such as by heat or laser treatment following steps that enclose the first material and covering material in a cavity or enclosure within a structure of a MEMS device. Thus, the thickness of the covering material may vary, e.g., depending on the type of covering material and the type of device that is being prepared. Exemplary thicknesses of a covering material may be in the micron range, e.g., from 0.1 to 100 microns, or from 0.5 to 10 microns. Still, thicknesses outside of these ranges may also be useful.

The shape of the area of coverage of the covering material will preferably be substantially the same shape as the area of coverage of the first material. This is because both areas of coverage are defined by the same opening in the same shadow mask. The difference in the two areas of coverage will be size, with the size of the area of coverage of the covering material being somewhat greater than the size of the area of coverage of the first material. If the first material covers a circular area, the covering materials will also cover a circular area, but one that is slightly larger. Likewise, if the first material covers a square, triangular, or irregular area, the covering materials will also cover a square, triangular, or irregular area that is slightly larger that the area of coverage of the first material but slightly larger.

According to the invention, the first (e.g., reactive) and second (coating) materials can be deposited onto a substrate by evaporating the materials as a vapor and directing the evaporated materials to a surface of the substrate for deposition onto the substrate. Such deposition processes normally take place in a vacuum, which provides a clean environment for processing and depositing the first and second materials, thereby minimizing contamination and/or undesirable reaction of the first and second materials. Vacuum deposition methods cause material to be evaporated (e.g., at high temperature) and deposited (e.g., condensed) onto a substrate (at a lower temperature). Optionally and preferably, methods and apparatus of the invention can involve cooling of the substrate to a temperature at which a desired material will become deposited at a substrate surface. Cooling can be accomplished by the use of water in thermal contact with the substrate. A useful temperature can be any temperature that will allow deposition of the evaporated material, e.g., for rubidium (as used in certain embodiments of the invention), about 0 C.

According to one particularly preferred method of preparing structures and devices of the invention, shadow mask vacuum deposition techniques can be used. These methods generally involve coating a substrate through a shadow mask that has an opening or aperture for defining areas of coverage of first (e.g., reactive) and second (covering) materials to be deposited sequentially through the same aperture onto a substrate such as a semiconductor (e.g., silicon) substrate or wafer, quartz, Pyrex, etc. The opening is preferably spaced apart by a predetermined distance from the substrate surface. The distance can be any useful distance, as will be appreciated by one of skill, and can be selected depending on factors such as the desired sizes of the areas of coverage for each of the first and second materials. Exemplary distances of the opening from the substrate area of deposition can be in the range of millimeters or microns, e.g., from about 20 microns to 100 microns.

According to one method for depositing materials onto a substrate, a first material can be deposited at an angle of incidence normal a surface of a substrate at a location at which the coating (deposition) is to occur (e.g., at an axis of rotation of the substrate, if the substrate is rotated). The substrate may be rotated if desired to improve deposition uniformity. The opening of the shadow mask thus shadows the substrate and defines an area of coverage of the first coated material onto the substrate.

The first coated material is covered by a second material by depositing the second material through the same opening of the shadow mask. Preferably, according to the invention, the area of coverage of the second material is larger than the area of coverage of the first material, so the first material is completely covered over its entire surface as well as at the edges and the first material is enclosed between the substrate and the second material. The second material thus includes an area of coverage that fully overlaps the area of coverage of the first material and that additionally goes past the edges of the area of coverage of the first material. This enlarged area of coverage of the first material can preferably take the same shape as the area of coverage of the first coated material, but be slightly larger. The second material can be deposited by any method useful to cover the first coated material and preferably a slightly larger area.

One exemplary method to produce an enclosed first material can include rotating the substrate and shadow mask fixture (fixed together), while placing the second material source at an oblique angle from the line between the area of substrate coated with the first material and the first material source (the first material source can preferably be substantially normal to the area of substrate that is coated by the first material)—e.g., the second material source may be at an angle that is oblique to an axis of rotation of the substrate, where the axis of rotation is normal to the surface at an area of deposition. By locating the second material source at an angle as described, and by rotating the shadow mask fixed to the substrate (with the passage a distance from the substrate surface), the area of coverage of the covering material can include and be greater than the area of coverage of the first material, and can be controlled by factors that include the angle of deposition of the covering material and the distance of the shadow mask from the substrate surface. As will be understood, a larger area of coverage for a covering material (compared to a first material) can be produced by other techniques as well, such as by locating the covering material source closer to the substrate (compared to the location of the first material source), rotating the source material instead of the substrate, or by rotating a substrate about an axis that is oblique (not normal) to its surface.

Following deposition of the first and second materials, the substrate can be further processed, e.g., to form a MEMS device. Subsequent processing steps can include steps that relate specifically to certain types of devices. In general, in the preparation of MEMS devices, the deposited first and second materials, on the substrate, are to become enclosed in a cavity or enclosure that is part of the MEMS device. This can be done by any of various techniques that are useful in preparing topography of silicon wafers or other substrates used in microelectronic device manufacturing. Examples of useful techniques can include etching, photolithography, laser drilling, electroplating, or other methods of producing topography or recesses in the relevant materials.

As an example, if first and second materials are formed in a recess or cavity of a substrate, that recess in the substrate may be covered or capped with a material (capping material) that is useful and compatible with a microelectronic or MEMS device (e.g., any of the materials useful as the substrate portion of the device such as ceramics, semiconductor materials, Pyrex, quartz, silicon, etc.), to form an enclosed cavity defined by the substrate (i.e., the cavity of the substrate) and the capping material. The cavity will contain at a surface of the substrate inside the cavity, the first material covered by the second material.

Other methods of forming a cavity of a MEMS device that contains the first and second materials can also be useful. As alternative methods, first and second materials may be deposited onto a surface of a substrate that is not recessed or part of a cavity, but that is flat and non-recessed. An enclosure or closed cavity can then be built up to surround that area of the substrate. The enclosure can be built by known methods of creating topography, such as those identified above, include photolithographic methods.

As yet another specific alternative of forming a cavity over a substrate surface and deposited first and second materials, a second component of a MEMS device can include a recess. The first and second materials can be deposited onto a flat portion of a substrate. The recess of the second component can be sized to cover the deposited first and second materials, and can be placed over the first and second materials, and the second component can be bonded to the substrate to enclose the first and second materials in the recess of the second component. The second component can be prepared from a material that is compatible with the MEMS device, such as any one of the materials useful as a substrate material or capping material.

The cavity or enclosure can preferably be produced in an atmosphere that will provide a desired atmosphere inside of the enclosure. The exact type of atmosphere that may be used may depend on factors such as the particular type of MEMS device that is being produced and the specific components used to prepare the device (e.g., the type of first and second materials, substrate, etc.). Examples of useful atmospheres include gaseous atmospheres such as inert gases (e.g., argon, nitrogen, or mixtures of these), or a vacuum environment (e.g., for an atomic clock).

After first and second coated materials have been enclosed in a cavity or enclosure of a MEMS device, an optional and preferable step can be to further process the second material while the second material is enclosed in the MEMS enclosure. One possible reason to process the second material at that time may be to degrade the second material. For instance, a second material may be degraded to disrupt the second material (e.g., possibly to produce a small hole, gap, or crack in the second material) to allow first material to be released from the covering of the second (covering) material. The first (e.g., reactive) material thereby releases from the covering of the covering material and escapes into the atmosphere of the enclosure, where the first material may preferably function as a component of a MEMS device.

Processing to degrade a second (coating) material that is contained within a MEMS enclosure can be accomplished by any useful method, such as application of laser radiation or heat. To treat with laser radiation, at least one component of the MEMS structure (e.g., a substrate or a capping material) can be transparent to laser radiation, to allow the laser radiation to irradiate the second material in a way that can heat the second material and cause the second material to degrade sufficiently to expose the first material. Alternatively, heat treatment can be performed by heating the MEMS device to a temperature that will degrade the second material, preferably to a temperature that will not at the same time detrimentally affect other components of the MEMS device.

A single embodiment of a device prepared according to the present description will now be described with reference to the exemplary figures included with this description. Referring first to FIG. 1, an exemplary vacuum deposition system 10 according to the invention is schematically illustrated. Generally, vacuum deposition system 10 includes a vacuum chamber 12, substrate stage 14, first material (here, e.g., a reactive material) source 16, second (covering) material source 18, and shutter 20.

Vacuum chamber 12 may be any enclosure or chamber or the like such as a bell jar, for example, capable of providing a desired vacuum level. As shown, vacuum chamber 12 includes port 22 that can be used for pumping vacuum chamber 12 to a desired vacuum level. Also, port 22 may be used for returning vacuum chamber 12 to atmospheric pressure such as by controllably venting vacuum chamber 12. Preferably, vacuum deposition system 10 also includes vacuum equipment such as pumps, valves, gauges, etc. (not shown) for providing and maintaining a desired vacuum level in the vacuum chamber 12.

As shown, reactive material source 16 is positioned within vacuum chamber 12 and includes furnace 24 that can be used to heat a source material provided in crucible 26. As such, a source material can be caused to evaporate from crucible 26 and can be deposited onto a substrate held by the substrate stage 14. Furnace 24 may include any heat source or the like for heating crucible 26 and may be driven by any desired power supply and control device such as those conventionally known. Reactive material source 16 also preferably includes an opening device 28. In use, a sealed crucible or ampule of reactive material can be positioned in the furnace 24 and heated to a desired temperature as described below. The opening device 28 can then be used to unseal the crucible 26 such that the reactive material can be evaporated from the crucible 26 in accordance with the invention as described in further detail below.

Further referring to FIG. 1, a covering material source 18 is preferably positioned within vacuum chamber 12 near reactive material source 16. Reactive material source 16 and covering material source 18 can be positioned with respect to shutter 20 and substrate stage 14 as described herein. In particular, reactive material source 16 and covering material source 18 can be positioned such that a deposition direction for each is at a predetermined angle with respect to a surface of the substrate that is to be deposited on or an axis of rotation of the substrate.

With respect to the reactive material source 16 and the covering material source 18, any deposition source and related techniques may be used. Techniques such as thermal evaporation, e-beam evaporation, sputtering, laser ablation, ion beam deposition, molecular beam epitaxy, and the like, may be used. Generally, any technique that can provide a material flux and a controllable deposition rate of a desired material within a vacuum can be used as a deposition source for either a first (e.g., reactive) material source 16 or a second (covering) material source 18 in accordance with the invention. In one embodiment, thermal evaporation can be used for a reactive material source and e-beam evaporation can be used for a covering material source.

As shown, substrate stage 14 includes a deposition fixture 30. Preferably, as described below in further detail, deposition fixture 30 of substrate stage 14 can hold and position a substrate and a shadow mask. Preferably, substrate stage 14 can include the capability to rotate the deposition fixture 30 at a desired rate. Also, as illustrated, substrate stage 14 can controllably position deposition fixture 30 at a desired angle with respect to a deposition direction for reactive material source 16 and covering material source 18. As illustrated, deposition fixture 30 and reactive material source 16 are positioned such that a deposition surface of a wafer held by deposition fixture 30 is positioned at an angle normal to a deposition direction 32 of reactive material source 16. Also, covering material source 18 is positioned with respect to reactive material source 16 and a deposition surface of a wafer held by deposition fixture 30 such that a deposition direction 34 of the covering material source 18 is positioned at an oblique angle with respect to the deposition surface. Exemplary angles of between about 1 degree and about 10 degrees, e.g., from 3 to 5 degrees, can be used in accordance with certain embodiments of the invention.

Further referring to FIG. 1, shutter 20 is positioned between the material sources (reactive material source 16 and covering material source 18) and substrate stage 14. As shown, shutter 20 includes an opening 36 that can be positioned to allow reactive material from reactive material source 16 to reach substrate stage 14 during a deposition process. Also as illustrated, shutter 20 includes opening 38 that can be positioned to allow covering material from covering material source 18 to reach substrate stage 14.

Preferably, shutter 20 is configured such that when reactive material source 16 is open, covering material source 18 is closed and when covering material source 18 is open, reactive material source 16 is closed. As such, reactive material source 16 and covering material source 18 can be used to selectively deposit materials as desired. Any shutter device may be used, however. For example, reactive material source 16 may include a shutter and covering material source 18 may include a separate distinct shutter.

Figure 2:
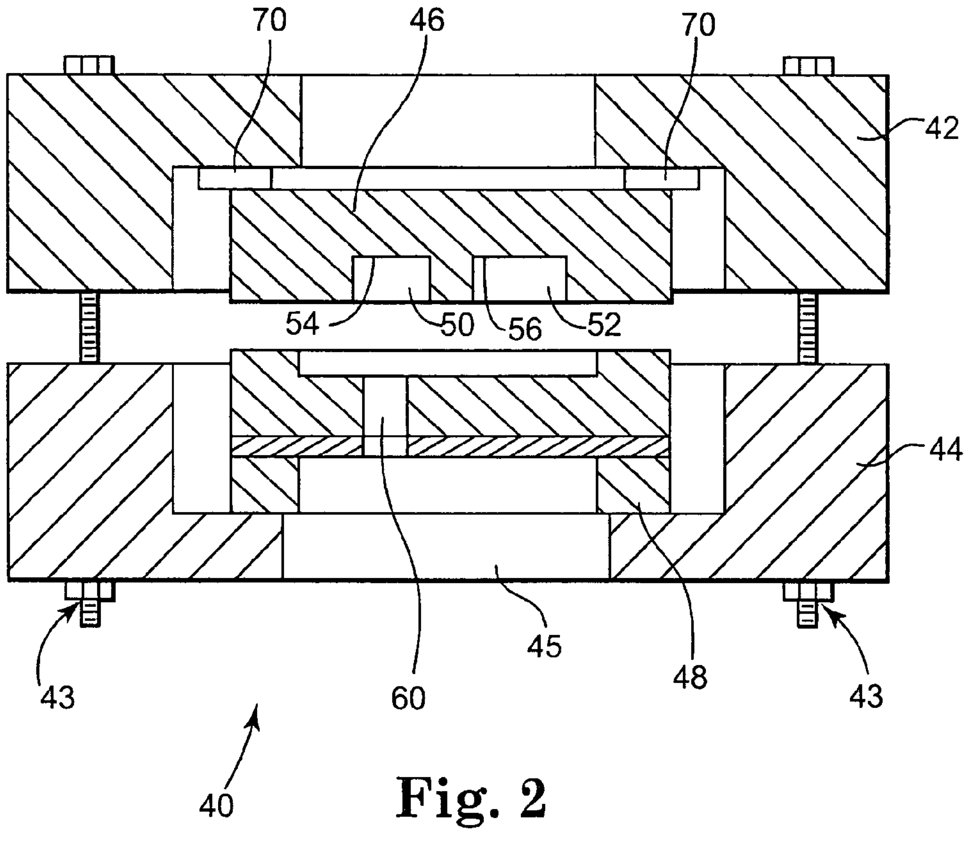
FIG. 2 is a cross-sectional view of a deposition fixture shown holding and positioning a wafer and a shadow mask.

Referring now to FIG. 2, an exemplary vacuum deposition fixture 40 of the invention is shown in cross-section. Vacuum deposition fixture 40 may be used in vacuum deposition system 10 shown in FIG. 1 as described below. As illustrated, deposition fixture 40 includes first and second fixture plates 42 and 44, respectively, that hold and position wafer 46 and shadow mask 48. As shown, wafer 46 and shadow mask 48 are spaced apart for illustration purposes. Also as shown, first and second fixture plates 42 and 44 are separate plates that are releasably clamped around wafer 46 and shadow mask 48 by fasteners 43 for holding wafer 46 and the shadow mask 48 in desired position with respect to each other. Preferably, second fixture plate 44 includes opening 45 that can allow deposition material to pass through second fixture plate 44, through a passage in shadow mask 48, and then become deposited on wafer 46. First and second fixture plates 42 and 44 are preferably formed from a vacuum-compatible material such as stainless steel, aluminum, or the like. However, any material suitable for vacuum processing may be used such as refractory metal, ceramics, glasses, and the like.

Figure 3:
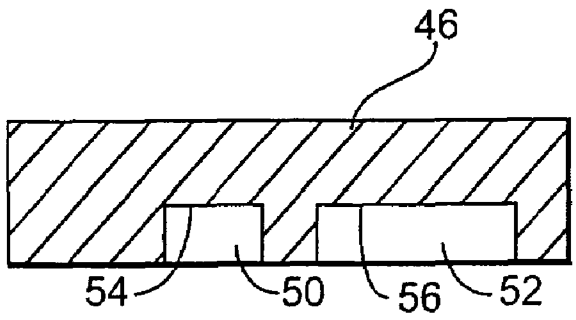
FIG. 3 is a cross-sectional view of the wafer of FIG. 2.

Wafer 46 is further illustrated in FIG. 3. As shown, wafer 46 includes first cavity 50 and second cavity 52. (Alternatively, according to the invention fewer or more, or no cavities may be included in a substrate.) First cavity 50 includes base surface 54, and second cavity 52 includes base surface 56. Wafer 46 may be formed from any desired material such as silicon, Pyrex, quartz, etc. First cavity 50 and second cavity 52 may have any desired shape and depth. For example, wafer 46 may be silicon. First cavity 50 or second cavity 52 can be cylindrical cavities that have a diameter of 0.5 to 2 mm and a depth of 0 to 1000 microns, e.g., a depth of 10 to 200 microns, for example. First and second cavities 50 and 52 may have the same or similar sizes and shapes or may have different sizes and shapes as well as depth. For example, as shown, second cavity 52 is larger than the first cavity 50. Preferably, such cavity structures are suitable for cell type atomic clock structures.

Figure 4:
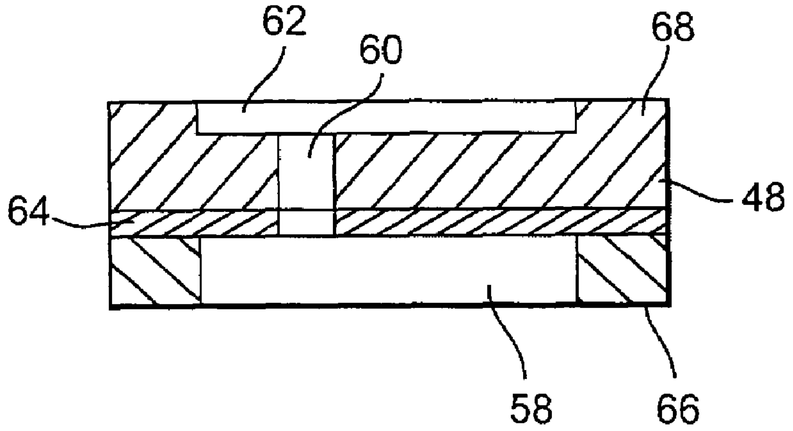
FIG. 4 is a cross-sectional view of the shadow mask of FIG. 2.

Shadow mask 48 is further illustrated in FIG. 4. As shown, shadow mask 48 includes clearance opening 58, mask opening 60, and relief opening 62. Mask opening 60 can be used to mask deposition material from a deposition source and to define a desired deposition area of coverage of a material deposited onto a substrate. Clearance opening 58 preferably provides access to mask opening 60. For example, where an oblique deposition source is used, clearance opening 58 can provide access to mask opening 60 while also allowing shadow mask 48 to maintain some thickness around a periphery of shadow mask 48, for providing strength or rigidity if needed. Relief opening 62 can be used to prevent undesirable contact between a surface of shadow mask 48 and a surface of a substrate (e.g., wafer 46).

Shadow mask 48 can be prepared using conventional semiconductor processing techniques. As one example, etch stop layer 64, such as silicon oxide or the like, can be formed on a surface of a silicon substrate 66. An exemplary etch stop layer may have a thickness of about 1 micron to about 5 microns. Next, a silicon layer 68 of a desired thickness can be formed on etch stop layer 64. For example, silicon layer 68 can be from about 5 microns to about 100 microns thick, e.g., from about 10 microns to about 15 microns thick. Clearance opening 58 can then be etched to etch stop layer 64 by any desired selective etch technique to form clearance opening 58. Relief opening 62 can be formed by any desired technique such as etching or the like. Relief opening 62 can be any useful size and depth, e.g., from about 5 to about 50 microns deep. Mask opening 60 can also be formed by any desired technique that can etch through etch stop layer 64 and silicon layer 68.

Referring back to FIG. 2, wafer 46 and mask wafer 48 are shown positioned in deposition fixture 40. As shown, wafer 46 and mask wafer 48 are spaced apart for purposes of illustration. Preferably, wafer 46 and mask wafer 48 are placed in contact with each other and may be releasably bonded together if desired. Also, as shown, spacer elements 70 are positioned between first fixture plate 42 and wafer 46 and can be used to help prevent damage to wafer 46. For example, spacer elements 70 may be rotated from Teflon or other similar vacuum compatible material. As illustrated, mask opening 60 is aligned with first cavity 50 and can be used to deposit material over a predetermined area on base surface 54 of first cavity 50. Mask opening 60 may be aligned with second cavity 52 for depositing material on base surface 56 of second cavity 52, if desired.

In a process in accordance with the present invention, vacuum deposition system 10 can be used to form a first (e.g., reactive) material layer that is covered by a covering material such as a non-reactive material on surface 54 of the cavity 50 or base surface 56 of cavity 52. In one exemplary process, deposition fixture 40 including wafer 46 and mask wafer 48 is positioned on substrate stage 14 of vacuum deposition system 10 shown in FIG. 1. For example, vacuum chamber 12 can be vented and deposition fixture 40 can be loaded onto substrate stage 14. Also, a sealed crucible containing a desired first material such as rubidium is preferably positioned in furnace 24 of first material source 16. Covering material source 18 is also preferably loaded with a desired covering material. Preferably, a covering material comprises a non-reactive material with respect to the reactive material. For example, where rubidium is used as the reactive material, aluminum may be used as the coating material (e.g., for structures used in atomic clock devices). Alternatively, where gallium is used as a reactive material, tungsten may be used as a covering material. In a preferred embodiment, an e-beam deposition process may be used for depositing a covering material.

The distances of the sources from the substrate surface upon which the materials are to be deposited can be any useful distances, as will be appreciated by one of skill in the vacuum deposition arts. The distance of the first material source from the substrate can be the same or different than the distance of the second material source from the substrate.

Next, vacuum chamber 12 can be pumped to achieve a desired vacuum level. For example, generally a high vacuum level such as about $1\times10^{-4}$ torr to about $1\times10^{-7}$ torr can be used. Depending on the particular vacuum deposition process used, the vacuum level may be higher or lower. For example, an ultra-vacuum regime may be used for a generally cleaner vacuum environment if desired.

After a desired vacuum level is achieved, furnace 24 may be used to bring crucible 26 to a desired temperature. Preferably, crucible 26 may be soaked at a desired temperature for some period of time to allow for thermal stabilization of the reactive material. For example, if a crucible containing about 5 grams of rubidium is used, the crucible may be soaked at about 200 degrees Celsius for about 30 minutes. The soak temperature and time may be determined empirically for a particular mass of a particular material. Generally, a temperature and time that will provide a stable deposition flux after the crucible is opened may be used.

At this point, shutter 20 can be in a position where both the reactive material source 16 and the covering material source 18 are closed from the deposition fixture positioned on substrate stage 14. While reactive material source 16 is soaking, covering material source 18 may also be soaked or conditioned for deposition. For example, where an e-beam source is to be used for depositing aluminum, the aluminum is preferably conditioned by the e-beam at a power level that would provide a deposition rate of less than about 100 angstroms per second. Such conditioning preferably heats up the covering (e.g., aluminum) source material and prepares the source for deposition.

After reactive material source 16 and covering material source 18 have been prepared for deposition as described above, the process may continue by opening the crucible of reactive material source 16. For example, a rubidium ampule that includes a breakable top or neck portion may be used. As such, the opening device 28 can be used to break the top portion off of the rubidium ampule to begin the deposition process.

The deposition fixture may optionally be rotated by the substrate stage 14 at any useful rate, e.g., a rate of about 0.1 to 100 rpm (e.g., from 1 revolution per second to 1 revolution per 5 seconds). In general, the rotational speed can be any speed that will provide a uniform coating of the material being coated (e.g., reactive material or coating material).

Preferably, shutter 20 is still blocking reactive material source 16 such that a stable deposition flux can be achieved. After a predetermined time for stabilization of the reactive material flux, shutter 20 is preferably opened. For example, for a rubidium ampule having about 5 grams of material that has been soaked at about 200 degrees Celsius for about 30 minutes, a stabilization time of about 30 seconds between opening the ampule and opening the shutter can be used. After a predetermined deposition time, shutter 20 is preferably moved to a position that closes reactive material source 16. As an example, a deposition rate of about 100 angstroms per second for a reactive material such as rubidium can be used to achieve a desired thickness of rubidium or other reactive material.

Next, shutter 20 is preferably moved to a position that opens covering material source 18. After a predetermined time for achieving a desired thickness of covering material, shutter 20 is preferably closed. Reactive material source 16 and covering material source 18 are preferably allowed to cool and the vacuum chamber 12 may be vented to remove the deposition fixture. Another substrate can then be loaded and the process can be repeated, if desired.

In the illustrated embodiment, reactive material source 16 is positioned such that deposition direction 32 is normal to a surface to be deposited on, such as the base surface of a cavity. Mask opening 60 of shadow mask 48 defines the area of coverage of the reactive material especially where a line of sight deposition technique is used. According to the illustrated embodiment of the invention, deposition direction 34 for the covering material is provided at an oblique angle to a surface to be deposited on, and the substrate is being rotated. Accordingly, the covering material will have an area of coverage that is slightly larger than the area of coverage of the reactive material. Varying the angle between the deposition direction 34 and the surface to be deposited on, allows adjustment of the area of coverage of the covering material. As an example, and angle of between about 1 degree and about 10 degrees, more preferably between about 3 degrees to 5 degrees can be used.

The present invention has now been described with reference to certain specific embodiments. The foregoing detailed description has been given for clarity of understanding. Others may recognize that changes can be made in the described embodiments without departing from the scope and spirit of the invention. Thus, the scope of the present invention should not be limited to the exact details and structures described herein.

What is claimed is:

1. A method for providing reactive material enclosed by covering material on a substrate, the method comprising providing a substrate having a surface, providing a shadow mask, positioning the shadow mask and substrate in a fixture so the shadow mask is in a position to align an aperture of the shadow mask with a portion of the surface, positioning the shadow mask and substrate in a vacuum deposition chamber having a reactive material deposition source and a covering material deposition source, providing a vacuum in the vacuum deposition chamber, evaporating reactive material from the reactive material deposition source such that the reactive material passes through the aperture of the shadow mask and deposits on the surface to define an area of coverage of the reactive material, the reactive material comprising rubidium, cesium, or gallium, and evaporating covering material from the covering material deposition source to produce an area of coverage of the covering material that is greater than the area of coverage of the reactive material and that includes the area of coverage of the reactive material, to enclose the reactive material coated on the substrate, wherein when the reactive material comprises rubidium or cesium, the covering material comprises aluminum, and when the reactive material comprises gallium, the covering material comprises tungsten.

2. The method of claim 1 wherein the area of coverage of the covering material is from 0.1 to 10 percent greater than the area of coverage of the reactive material.

3. The method of claim 1 comprising rotating the substrate on an axis through the portion of surface and perpendicular to the portion of surface, during evaporation of the covering material, and wherein the covering material deposition source is located at an angle oblique to the axis.

4. The method of claim 1 comprising positioning the shadow mask and substrate in the fixture to fix the shadow mask against the substrate.

5. The method of claim 4 wherein the shadow mask aperture is a distance in the range from about 20 to 100 microns from the portion of surface.

6. The method of claim 1 comprising depositing a layer of reactive material having a thickness in the range from 0.5 to 10 microns.

7. The method of claim 1 comprising depositing a layer of covering material over the deposited reactive material, the covering material having a thickness of from about 0.5 to 10 microns.

8. The method of claim 1 wherein during evaporating of the reactive material, the substrate is rotated on an axis normal to and through the portion of surface.

9. The method of claim 1 wherein during evaporating of the covering material, the substrate is rotated on an axis normal to and through the portion of surface, at a speed in the range from 10 revolutions per second to 1 revolution per 5 seconds.

10. The method of claim 9 wherein the covering material deposition source is at an angle of incidence in the range from about 1 to about 10 degrees from the axis.

11. A method for providing layers of material on a substrate, the method comprising providing a substrate including a surface, fixing a shadow mask over the substrate in a position to align an aperture of the shadow mask with a portion of the surface, positioning the shadow mask and substrate in a vacuum deposition chamber having a first material deposition source and a second material deposition source, providing a vacuum in the vacuum deposition chamber, evaporating first material from the first material deposition source at an angle of incidence substantially normal to the portion of surface, such that the first material passes through the aperture of the shadow mask and deposits on the portion of surface to define an area of coverage of the first material, the first material comprising rubidium, cesium, or gallium, and while rotating the substrate and shadow mask on an axis normal to the portion of surface, evaporating second material from the second material deposition source at an angle of incidence oblique to the axis, such that the second material passes through the aperture of the shadow mask and deposits on the first material to produce an area of coverage of the second material greater than the area of coverage of the first material and including the area of coverage of the first material, wherein when the first material comprises rubidium or cesium, the second material comprises aluminum; and when the first material comprises gallium, the second material comprises tungsten.

12. A method of preparing a microelectronic mechanical device, the method comprising depositing first material onto a substrate surface, depositing second material over the first material from an oblique angle relative to the substrate surface to enclose the first material, encapsulating the first and second materials deposited on the substrate within a cavity, and degrading the second material so that at least a portion of the first material escapes into the cavity.

13. The method of claim 12 wherein the first material is a reactive material.

14. The method of claim 12 wherein the second material is a degradable material that can be degraded by heat or laser radiation.

15. The method of claim 12 wherein the step of encapsulating the first and second materials comprises forming an enclosure that comprises a material that is transparent to laser radiation.

16. The method of claim 15 comprising degrading the second material by laser irradiation.

17. The method of claim 12 comprising degrading the second material by heating the second material.

18. The method of claim 12 wherein when the first material comprises rubidium, the second material comprises aluminum; and when the first material comprises gallium, the second material comprises tungsten.

19. The method of claim 12 comprising depositing the first material from a perpendicular angle relative to the substrate surface.

20. The method of claim 12 comprising providing a shadow mask and positioning the shadow mask and substrate in a fixture so the shadow mask is in a position to align an aperture of the shadow mask with a portion of the substrate surface.

21. A method for providing reactive material enclosed by covering material on a substrate, the method comprising providing a substrate having a surface, fixing a shadow mask over the substrate in a position to align an aperture of the shadow mask with a portion of the surface, positioning the shadow mask and substrate in a vacuum deposition chamber having a reactive material deposition source and a covering material deposition source, providing a vacuum in the vacuum deposition chamber, evaporating reactive material from the reactive material deposition source such that the reactive material passes through the aperture of the shadow mask and deposits on the surface to define an area of coverage of the reactive material, and evaporating covering material from the covering material deposition source to produce an area of coverage of the covering material that is greater than the area of coverage of the reactive material and that includes the area of coverage of the reactive material, to enclose the reactive material coated on the substrate, wherein when the reactive material comprises rubidium, the covering material comprises aluminum and when the reactive material comprises gallium, the covering material comprises tungsten.

22. The method of claim 21 wherein the surface of the substrate is within a cavity in the substrate.

* * * * *